(12) United States Patent
Lin et al.

(10) Patent No.: US 6,656,847 B1
(45) Date of Patent: Dec. 2, 2003

(54) METHOD FOR ETCHING SILICON NITRIDE SELECTIVE TO TITANIUM SILICIDE

(75) Inventors: Huan Just Lin, Hsin-chu (TW); Chia-Shiung Tsai, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/431,240

(22) Filed: Nov. 1, 1999

(51) Int. Cl.[7] ................ H01L 21/302; H01L 21/3065
(52) U.S. Cl. .............. 438/706; 438/721; 438/723; 216/62
(58) Field of Search .................. 438/706, 723, 438/721, 724; 216/62

(56) References Cited

U.S. PATENT DOCUMENTS

| | | | |
|---|---|---|---|
| 4,208,241 A | * 6/1980 | Harshbarger et al. | 156/643 |
| 4,529,476 A | 7/1985 | Kawamoto et al. | 156/643 |
| 5,258,096 A | 11/1993 | Sandhu et al. | 156/643 |
| 5,366,590 A | 11/1994 | Kadomura | 156/662 |
| 5,468,342 A | 11/1995 | Nulty et al. | 156/643.1 |
| 5,611,888 A | * 3/1997 | Bosch et al. | 438/724 |
| 5,728,619 A | 3/1998 | Tsai et al. | 438/297 |
| 5,757,045 A | * 5/1998 | Tsai et al. | 257/336 |
| 5,786,276 A | 7/1998 | Brooks et al. | 438/724 |
| 6,087,264 A | * 7/2000 | Shin et al. | 438/706 |
| 6,139,702 A | * 10/2000 | Yang et al. | 204/192.37 |

FOREIGN PATENT DOCUMENTS

JP 10125623 A * 5/1998 ............ H01L/21/28

OTHER PUBLICATIONS

Sugawara, Manufacture of Semiconductor Device, (English Abstract of JP 10125623 A), May 15, 1998, 2 pages.*

* cited by examiner

*Primary Examiner*—Nadine G. Norton
*Assistant Examiner*—Lynette T. Umez-Eronini
(74) *Attorney, Agent, or Firm*—George O. Saile; Stephen B. Ackerman

(57) ABSTRACT

The invention provides a method for etching silicon nitride selective to titanium silicide and fabricating multi-level contact openings on a quartermicron device using a two step etch process. The process begins by providing a substrate having thereover a silicon nitride hard mask at one level and a titanium silicide layer at another level wherein the silicon nitride hard mask and the titanium silicide region have an oxide layer thereover. In a first etch step, the oxide layer is patterned to form a first contact opening and a second contact opening. The first contact opening stops on the silicon nitride hard mask and the second contact opening stops on the titanium silicide region. In a second etch step the silicon nitride hard mask is etched through in the first contact opening using an etch selective to titanium silicide. The etch comprises $CH_2F_2$ and $O_2$ at a ratio of $CH_2F_2$ to $O_2$ of between about 2 and 4.

10 Claims, 1 Drawing Sheet

METHOD FOR ETCHING SILICON NITRIDE SELECTIVE TO TITANIUM SILICIDE

BACKGROUND OF INVENTION

1) Field of the Invention

This invention relates generally to fabrication of semiconductor devices and more particularly to the etching of silicon nitride selective to titanium silicide and the formation of multi-level contact openings for quartermicron devices using an oxide etch followed by an in-situ silicon nitride etch selective to titanium silicide.

2) Description of the Prior Art

In semiconductor manufacturing, such as a DRAM device, silicon nitride hard masks are often used to protect gates during subsequent processing. In these same devices, titanium silicide is often used, such as on source and drain regions. Typically, both the silicon nitride hard mask and the titanium silicide have an overlying dielectric layer composed of one or more layers of silicon oxide, BPTEOS, PETEOS, and the like. It is desirable to form contact openings to form interconnections to the gate and titanium silicide. However, to form these contact openings, it is necessary to etch through the dielectric layer and the silicon nitride hard mask without damaging the titanium silicide. As device geometry is scaled down to quartermicron and below, the aspect ratio increases to greater than 8, further complicating the contact opening etch.

The importance of overcoming the various deficiencies noted above is evidenced by the extensive technological development directed to the subject, as documented by the relevant patent and technical literature. The closest and apparently more relevant technical developments in the patent literature can be gleaned by considering the following US Patents.

U.S. Pat. No. 4,529,476 (Kawamoto et al.) teaches a $CH_2F_2$—$O_2$ etch through a BPTEOS/PETEOS oxide and a SiN hard mask.

U.S. Pat. No. 5,728,619 (Tsai) discloses a $C_xH_yF_z$ etch through oxide and stopping on a $TiSi_x$ layer.

U.S. Pat. No. 5,366,590 (Kadomura) teaches an oxide etch using a high density plasma with high selectivity to $Si_3N_4$.

U.S. Pat. No. 5,468,342 (Nulty et al.) shows an oxide etch using a SiN hard mask using $CH_2F_2$.

U.S. Pat. No. 5,786,276 (Brooks et al.) teaches a $C_xH_yF_z$—$O_2$ etch of SiN over $SiO_2$.

U.S. Pat. No. 5,258,096 (Sandhu et al.) teaches an etch through for a BPTEOS/PETEOS oxide stopping on a conductive landing pad.

SUMMARY OF THE INVENTION

It is an object of the present invention to provide a method of etching silicon nitride selective to titanium silicide.

It is another object of the present invention to form low resistance, multi-level contact openings on DRAM devices without damaging titanium silicide layers that are exposed during the etching process.

It is another object of the present invention to etch through a silicon nitride hard mask in a contact opening having an aspect ratio greater than 8, using an etch selective to titanium silicide.

It is yet another object of the present invention to perform the etches of the previous objects in-situ.

To accomplish the above objectives, the present invention provides a method for etching silicon nitride selective to titanium silicide and a two step etch for fabricating multi-level contact openings on a quartermicron device. The process begins by providing a substrate (10) having thereover a silicon nitride hard mask (20) at one level and a titanium silicide layer (30) at another level wherein the silicon nitride hard mask (20) and the titanium silicide region (30) have an oxide layer (40) thereover. In the first step, the oxide layer (40) is patterned to form a first contact opening (25) and a second contact opening (35). The first etch step is performed using $C_4F_8$/CO/Ar/$O_2$ chemistry. The first contact opening (25) stops on the silicon nitride hard mask (20) and the second contact opening (35) stops on the titanium silicide region (30). In the second etch step, any remaining oxide and the silicon nitride hard mask (20) are etched through in the first contact opening (25) using an etch selective to titanium silicide. The etch comprises $CH_2F_2$ and $O_2$ at a ratio of $CH_2F_2$ to $O_2$ of between about 2 and 4. A key feature of the invention is the second etch step ratio of $CH_2F_2$ to $O_2$ which controls the selectivity of nitride to titanium silicide.

The present invention provides considerable improvement over the prior art. A key advantage of the present invention is the second etch step selectivity of silicon nitride to titanium silicide. The inventors have discovered that controlling the $O_2$ flow rate in a $CH_2F_2$ silicon nitride etch, has the unexpected result of etching silicon nitride with high selectively to titanium silicide. This etch selectivity enables them to thoroughly etch through a silicon nitride hard mask (20) forming a low resistance first contact opening (25) without etching through a titanium silicide region (30) in the second contact opening (35).

Because the etch selectivity allows the silicon nitride hard mask to be thoroughly etched through, a contact resistance of less than 10 Ohms can be acheived, providing enhanced performance.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for etching silicon nitride selective to titanium silicide, and a method for forming high aspect ratio contact openings through a silicon nitride hard mask without etching through titanium silicide regions of the device.

Figure 1:
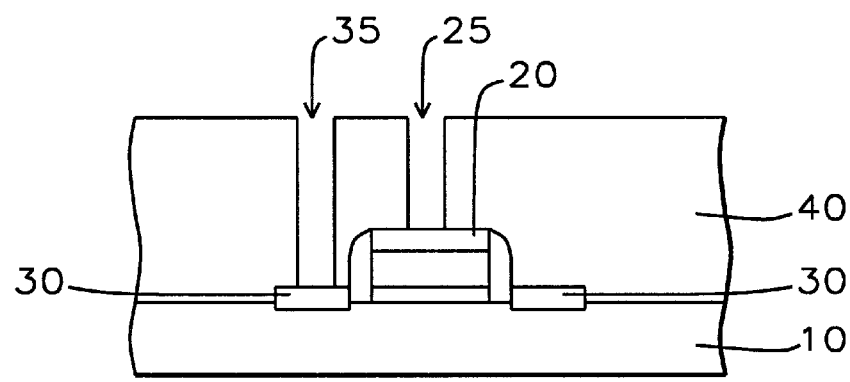
FIGS. 1 & 2 illustrate sequential sectional views of a process for fabrication of multi-level contact openings according to the invention.

Referring to FIG. 1, a substrate (10) is provided which has undergone some processing. The substrate (10) has thereover a region containing a silicon nitride hard mask (20), formed and used in said processing, at one level and a laterally displaced region containing a titanium suicide layer (30), formed in said processing, at another level. The silicon nitride hard mask (20) and the titanium silicide region (30) have an oxide layer (40) thereover. The oxide layer can consist of one or more layers of silicon dioxide, BPTEOS, PETEOS, and other dielectric silicon oxides as are know in the art.

Contact openings (25,35) are formed using a two step etch process. In the first etch step, the oxide layer (40) is patterned to form a first contact opening (25) and a second contact opening (35). The first contact opening preferably has a width of between about 0.28 μm and 0.32 μm and a depth of between about 2.7 μm and 2.9 μm, and the second contact opening preferably has a width of between about 0.28 μm and 0.32 μm and a depth of between about 2.9 μm and 3.1 μm. The oxide layer can be patterned using conventional photolithography and a silicon oxide etch.

For the first etch step, the silicon nitride hard mask (20) preferably acts as an etch stop for the first contact opening (25), and the titanium silicide region (30) preferably acts as an etch stop for the second contact opening (35), wherein both the silicon nitride hard mask (20) and the titanium silicide region (30) are exposed in preparation for the subsequent second etch. The silicon oxide etch is preferably performed in an oxide etcher such, as a Magnetic Enhanced Reactive Ion Etch (MERIE) etcher with a magnetic field of between about 20 gauss and 40 gauss and a DC bias of between about −800 V and −1200 V. The first etch step can be performed at a pressure of between about 30 mTorr and 40 mTorr, at a power of between about 1200 W and 1800 W, using $C_4F_8$, CO, Ar and $O_2$ having a $C_4F_8$ to CO flow rate ratio of between about 0.25 and 0.4, a $C_4F_8$ to Ar flow rate ratio of between about 0.08 and 0.15, and a $C_4F_8$ to $O_2$ flow rate ration of between about 2 and 3. For example, the first etch step reipe can be:

35 mt/1500 W/20$C_4F_8$/60CO/180Ar/8$O_2$.

Figure 2:
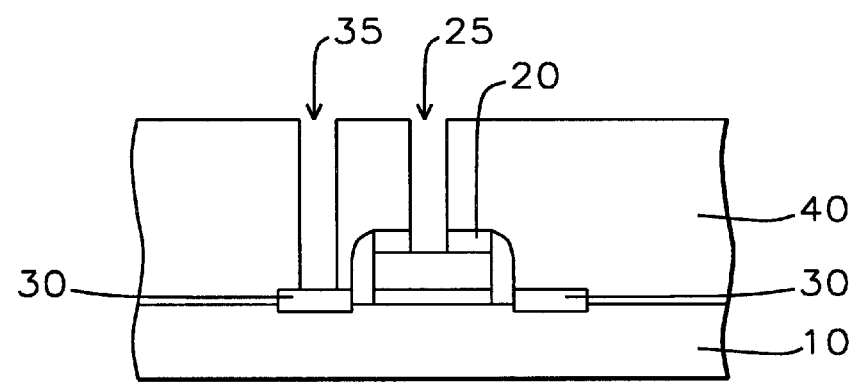

Referring to FIG. 2, in the second etch step, any remaining silicon oxide and the silicon nitride hard mask (20) are etched through without significantly etching the titanium silicide region (30). The silicon nitride hard mask etch (e.g. second etch step) is preferably performed in-situ, using an etch comprising Ar, $CH_2F_2$ and $O_2$. The silicon nitride hard mask etch preferably has a flow rate ratio of $CH_2F_2$ to $O_2$ between about 2 and 4 and a flow rate ratio of $CH_2F_2$ to Ar of between about 0.2 and 0.5. Alternatively $N_2$ or Xe can be used in place of Argon.

The second etch step is prefererably performed in a MERIE etcher at a pressure of between about 20 mTorr and 60 mTorr, with a target of about 40 mTorr. A power of between about 100 Watts and 500 Watts is used, with a target of about 150 Watts. The gas flow rates are: between about 15 sccm and 25 sccm of $CH_2F_2$, between about 5 sccm and 10 sccm of $O_2$, and between about 400 sccm and 600 sccm of Ar. The target gas flow rates are about 20 sccm of $CH_2F_2$, about 8 sccm of $O_2$ and about 500 sccm of Ar, athough it should be understood by those skilled in the art that the gas flow rates can be scaled up or down, while maintaining the same molar concentrations, to accomodate particular etch chambers. While a MERIE etch chamber is preferred, other etch chambers, such as a Mxpt chamber can be used.

A key advantage of the present invention is the etch selectivity of silicon nitride to titanium silicide. The inventors have discovered that by controlling the $O_2$ flow rate in a $CH_2F_2$ silicon nitride etch, silicon nitride can be etched selectively to titanium silicide enabling them to thoroughly etch through a silicon nitride hard mask (20) forming a low resistance first contact opening (25) without etching through the titanium silicide region (30) in the second contact opening (35). Using a MERIE oxide etcher with the foregoing parameters, the inventors have etched silicon nitride with a selectivity to titanium silicide (SiN/TiSi,) of about 20 and formed a gate contact having a contact resistance of less than 10 Ohms.

A metal contact can be formed in the first contact opening (25) by depositing a metal layer over the oxide layer (40) and performing an etch back as is known in the art. Because the etch selectivity allowed for the silicon nitride hard mask to be thoroughly etched through, a contact resistance of less than 10 Ohms can be acheived, providing enhanced performance.

While the invention has been particularly shown and described with reference to the preferred embodiments thereof, it will be understood by those skilled in the art that various changes inform and details may be made without departing from the spirit and scope of the invention.

What is claimed is:

1. A method for etching silicon nitride selective with respect to titanium silicide consisting of the steps of:
   a. providing a substrate having thereover a first region and a second region, the second region being laterally displaced from the first region, the first region containing an exposed silicon nitride layer and the laterally displaced second region containing an exposed titanium silicide layer;
   b. etching said exposed silicon nitride layer using a reactive ion etch comprising a controlled flow rate ratio of $CH_2F_2$ and $O_2$; whereby said exposed silicon nitride layer is etched selective with respect to titanium silicide.

2. The method of claim 1 wherein said controlled flow rate ratio of $CH_2F_2$ to $O_2$ is between about 2 and 4.

3. The method of claim 1 wherein said etch is performed in a magnetic enhanced reactive ion etcher at a pressure of between 20 mTorr and 60 mTorr; at a power of between 100 Watts and 500 Watts; with a flow rate ratio of $CH_2F_2$ to $O_2$ of between about 2 and 4 and a flow rate ratio of $CH_2F_2$ to Ar of between about 0.2 and 0.5.

4. A method for fabricating multi-level contact openings on quarter-micron devices consisting of the steps of:
   a. providing a substrate having thereover a silicon nitride hard mask at one level and a titanium silicide layer at another level; said silicon nitride hard mask and said titanium suicide region having an oxide layer thereover;
   b. in a first etch step, etching said oxide layer to form a first contact opening and a second contact opening said first contact opening exposing said silicon nitride hard mask and said second contact opening exposing said titanium silicide region;
   c. in a second etch step, etching through said exposed silicon nitride hard mask in said first contact opening using an etch selective to titanium silicide; said etch comprising $CH_2F_2$ and $O_2$ at a flow rate ratio of $CH_2F_2$ to $O_2$ of between about 2 and 4.

5. The method of claim 4 wherein said first contact opening has an aspect ratio greater than 8.

6. The method of claim 4 wherein the width of said first contact opening is between 0.28 μm and 0.32 μm, and the width of said second contact opening is between 0.28 μm and 0.32 μm.

7. The method of claim 4 wherein the first etch step (step b) is performed at a pressure of between 30 mTorr and 40 mTorr; at a power of between about 1200 Watts and 1800 Watts; in an atmosphere comprising $C_4F_8$, CO, Ar and $O_2$ having a $C_4F_8$ to CO flow rate ratio of between about 0.25 and 0.4, a $C_4F_8$ to Ar flow rate ratio of between about 0.08 and 0.15, and a $C_4F_8$ to $O_2$ flow rate ratio of between about 2 and 3.

8. The method of claim 4 wherein the second etch step (step c) is performed in-situ.

9. The method of claim 4 wherein said first etch step and said second etch step are performed in-situ.

10. The method of claim 4 which further includes forming a metal contact in said first contact opening; said contact having a contact resistance of less than 10 ohms.

* * * * *